(12) United States Patent
Lin et al.

(10) Patent No.: US 12,027,548 B2
(45) Date of Patent: Jul. 2, 2024

(54) IMAGE SENSOR

(71) Applicant: VisEra Technologies Company Limited, Hsin-Chu (TW)

(72) Inventors: Cheng-Hsuan Lin, Taipei (TW); Yu-Chi Chang, Hukou township (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 344 days.

(21) Appl. No.: 17/116,700

(22) Filed: Dec. 9, 2020

(65) Prior Publication Data

US 2022/0181370 A1 Jun. 9, 2022

(51) Int. Cl.
*H01L 27/146* (2006.01)
*G02B 7/36* (2021.01)

(52) U.S. Cl.
CPC .......... *H01L 27/14623* (2013.01); *G02B 7/36* (2013.01); *H01L 27/14643* (2013.01)

(58) Field of Classification Search
CPC ................................ H01L 27/146; G02B 7/36
See application file for complete search history.

(56) References Cited

U.S. PATENT DOCUMENTS

| | | | |
|---|---|---|---|
| 9,571,721 B2 | 2/2017 | Kitano | |
| 2016/0352983 A1 | 12/2016 | Boettiger et al. | |
| 2018/0076247 A1 | 3/2018 | Pang et al. | |
| 2019/0035838 A1 | 1/2019 | Byun | |
| 2019/0052823 A1 | 2/2019 | Jung et al. | |
| 2019/0319060 A1 | 10/2019 | Do | |
| 2020/0404203 A1* | 12/2020 | Jung | ................. H01L 27/14621 |
| 2021/0183928 A1* | 6/2021 | Hoshi | ............... H01L 27/14627 |
| 2022/0149097 A1* | 5/2022 | Li | ....................... H01L 27/1463 |

FOREIGN PATENT DOCUMENTS

| | | |
|---|---|---|
| CN | 109390361 A | 2/2019 |
| JP | 2015233043 A | 12/2015 |
| JP | 2017011207 A | 1/2017 |
| KR | 1020190017197 | 2/2019 |

(Continued)

OTHER PUBLICATIONS

Office Action in corresponding JP application No. 2021-071681 issued May 17, 2022, with English translation, 8 pages.

(Continued)

*Primary Examiner* — Evren Seven
*Assistant Examiner* — Cole Leon Lindsey
(74) *Attorney, Agent, or Firm* — MUNCY, GEISSLER, OLDS & LOWE, P.C.

(57) ABSTRACT

An image sensor includes: a group of autofocus sensor units; neighboring sensor units adjacent to and surrounding the group of autofocus sensor units, wherein each of the neighboring sensor units has a first side close to the group of autofocus sensor units, and a second side away from the group of autofocus sensor units. The image sensor further includes: a first light shielding structure disposed between the group of autofocus sensor units and the neighboring sensor units; a first extra light shielding structure laterally extending from the first light shielding structure and disposed on at least one of the first side and the second side of one or more of the neighboring sensor units.

17 Claims, 10 Drawing Sheets

(56) References Cited

FOREIGN PATENT DOCUMENTS

| | | |
|---|---|---|
| KR | 1020190049459 A | 5/2019 |
| KR | 1020190118814 | 10/2019 |
| TW | 202014734 A | 4/2020 |
| TW | 1699007 B | 7/2020 |
| TW | 202043808 A | 12/2020 |

OTHER PUBLICATIONS

Office Action in corresponding KR application No. 10-2021-0008671 issued Jul. 15, 2022, with English translation, 9 pages.
Office action and search report from TW Application No. 110104432 issued on Dec. 22, 2021, 10 pages.
Office Action of JP Application No. 2021-071681 issued on Nov. 29, 2022 and English translation, 10 pages.
Office Action of KR Application No. 10-2021-0008671 issued on Jan. 15, 2023 and English translation, 10 pages.

* cited by examiner

IMAGE SENSOR

BACKGROUND

Technical Field

The present disclosure relates to an image sensor, and it particularly relates to the arrangement of light shielding structure of the image sensor.

Description of the Related Art

Image sensors, such as complementary metal oxide semiconductor (CMOS) image sensors (also known as CIS), are widely used in various image-capturing apparatuses such as digital still-image cameras, digital video cameras, and the like. The light sensing portion of the image sensor may detect ambient color change, and signal electric charges may be generated depending on the amount of light received in the light sensing portion. In addition, the signal electric charges generated in the light sensing portion may be transmitted and amplified, whereby an image signal is obtained.

Based on industrial demand, pixel size has continuously been reduced. In order to maintain high levels of performance, a group of Phase Difference Auto Focus (PDAF) pixels can be integrated into the conventional pixels. Light received by the group of PDAF pixels may converge through the color filter, to be collected at the sensing portion at the bottom, and the image focus for the apparatus is detected. An image sensor with a minimized pixel size may experience a slight offset in precision, which can significantly affect the overall performance of the device. Therefore, these and related issues need to be addressed through the design and manufacture of the image sensor.

SUMMARY

In an embodiment, an image sensor includes a group of autofocus sensor units. Neighboring sensor units are adjacent to and surrounding the group of autofocus sensor units, wherein each of the neighboring sensor units has a first side close to the group of autofocus sensor units, and a second side away from the group of autofocus sensor units. The image sensor includes a first light shielding structure disposed between the group of autofocus sensor units and the neighboring sensor units; a first extra light shielding structure is laterally extending from the first light shielding structure and disposed on at least one of the first side and the second side of one or more of the neighboring sensor units.

In another embodiment, an image sensor includes a group of autofocus sensor units. Neighboring sensor units are adjacent to and surrounding the group of autofocus sensor units, wherein each of the neighboring sensor units has a first side close to the group of autofocus sensor units, and a second side away from the group of autofocus sensor units. The image sensor includes a first light shielding structure disposed between the group of autofocus sensor units and the neighboring sensor units, wherein the first light shielding structure includes a plurality of first enlarged portions on at least one of the first side and the second side of the neighboring sensor units, wherein the first enlarged portions are arranged symmetrically around a center point of the group of autofocus sensor units.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1:
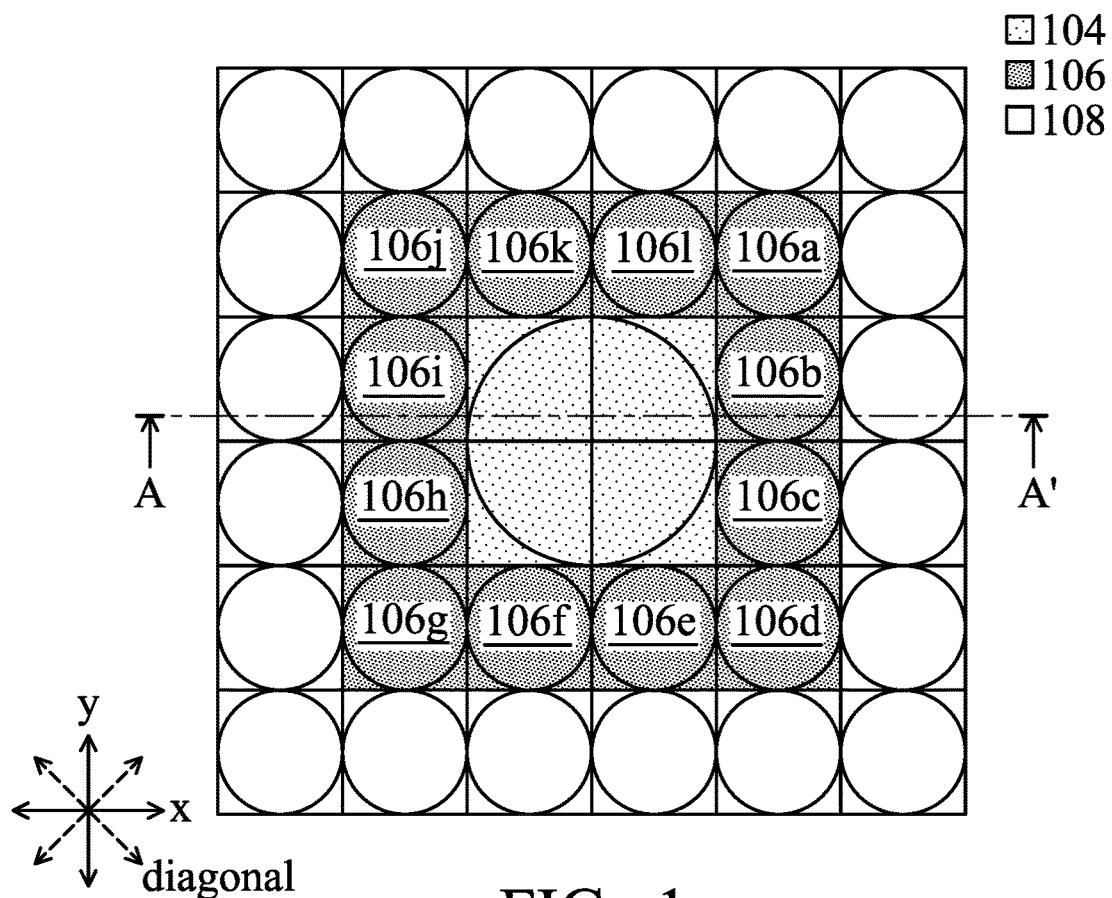
FIG. 1 is a top view of an image sensor, including variety of sensor units, according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean±20% of the stated value, more typically ±10% of the stated value, more typically ±5% of the stated value, more typically ±3% of the stated value, more typically ±2% of the stated value, more typically ±1% of the stated value and even more typically ±0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the prior art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

The light shielding structure conventionally separates each sensor unit (or pixel) from the others, so the color filter will convert incident light into the desired color of each sensor unit without being affected by adjacent sensor units. However, the addition of a group of autofocus sensor units (also known as Phase Difference Auto Focus (PDAF) pixels) may undermine the cycling effect traditional image sensors have, in which micro-lenses of identical dimensions are arranged continuously. Therefore, when light does not enter at a direction normal to the image sensor plane (for example, at an inclined angle with respect to the image sensor plane), shielding effect may occur, where one sensor unit adjacent to the group of autofocus sensor units may receive less light than another sensor unit adjacent to the group of autofocus sensor units. As a result, the sensor units among the device do not have uniform sensitivity. The present disclosure provides an innovative way of arranging the light shielding structure to address the above issues. The light shielding structure of the present disclosure may block excessive light, thereby resulting in higher uniformity on the sensitivity among the image sensor.

FIG. 1 is a top view of an image sensor, including variety of sensor units, according to some embodiments of the present disclosure. In some embodiments, image sensors may contain millions of sensor units in reality. The present disclosure displays a portion of an actual image sensor, which may be separated into three groups. At the center, four sensor units constitute into a group of autofocus sensor units 104. According to some embodiments of the present disclosure, the group of autofocus sensor units 104 is arranged in 2×2, but the present disclosure is not limited thereto. In some embodiments, the autofocus sensor units 104 may correspond to m×n photoelectric conversion elements, in which m and n are positive integers that can be the same or different, but the present disclosure is not limited thereto. Please note that there is only one micro-lens disposed on the entire group of autofocus sensor units 104, which means that the micro-lens will have a different dimension (such as bottom area, height, and/or radius of curvature) from those on the other sensor units. According to some embodiments of the present disclosure, when the light is evenly received by each autofocus sensor unit within the group, the image sensor will be in focus. However, if the light received by each autofocus sensor unit is uneven, then the image sensor would be out of focus. Therefore, the group of autofocus sensor units 104 may detect and track image focus for the overall device.

Refer to FIG. 1. The sensor units immediately adjacent to and surrounding the group of autofocus sensor units 104 are neighboring sensor units 106. For the purpose of clarity, neighboring sensor units 106 are further specified into neighboring sensor units 106*a*, 106*b*, 106*c*, 106*d*, 160*e*, 106*f*, 106*g*, 106*h*, 106*i*, 106*j*, 106*k*, and 106*l*. Lastly, the sensor units at the periphery are surrounding sensor units 108. According to some embodiments of the present disclosure, the neighboring sensor units 106 may further be classified based on axial direction with respect to the group of autofocus sensor units 104. For example, neighboring sensor units 106*b*, 106*c*, 106*h*, and 106*i* are x-axis units; neighboring sensor units 106*e*, 106*f*, 106*k*, and 106*l* are y-axis units; and neighboring sensor units 106*a*, 106*d*, 106*g*, and 106*j* are diagonal units. According to some embodiments of the present disclosure, micro-lenses on every neighboring sensor unit 106 and surrounding sensor unit 108 have identical dimension.

Figure 2A:
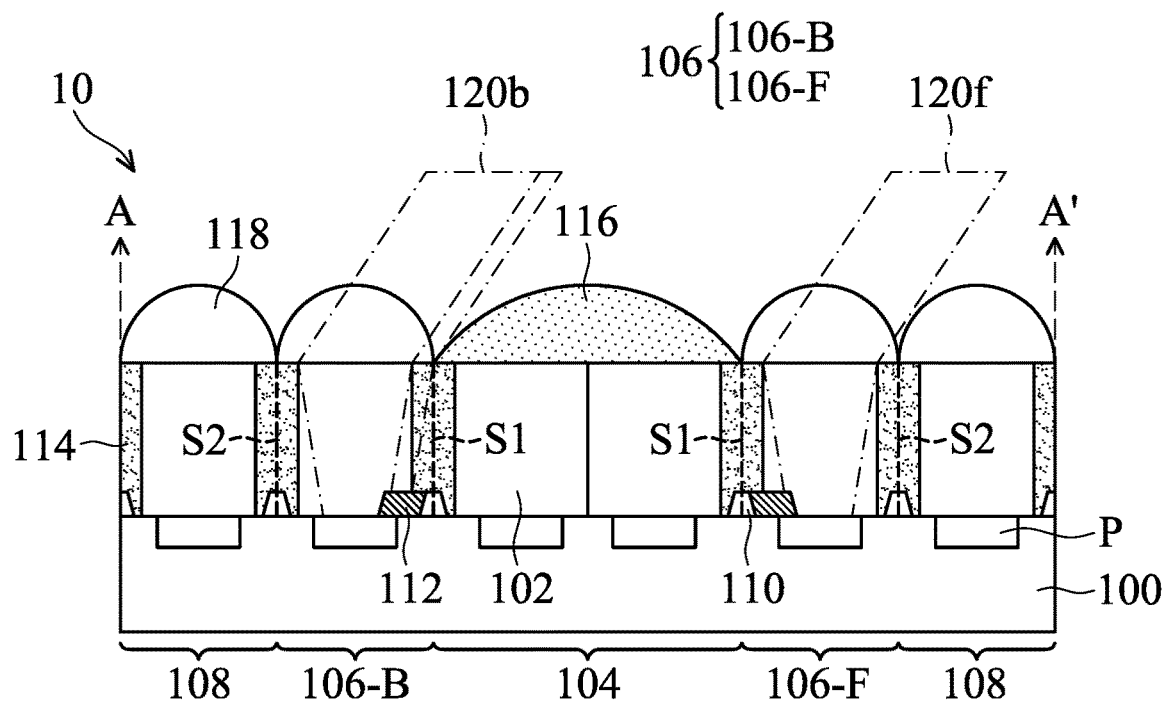
FIGS. 2A-2C are cross-sectional views of the image sensor shown in FIG. 1, according to some embodiments of the present disclosure.
Figure 2B:
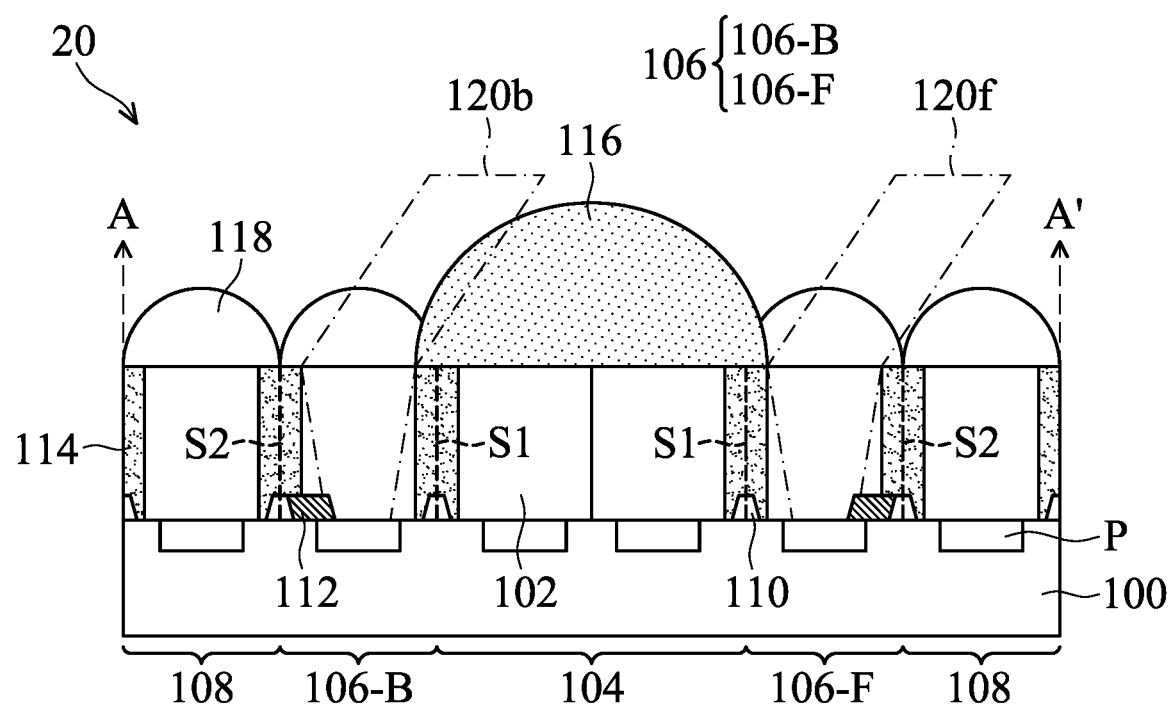
Figure 2C:
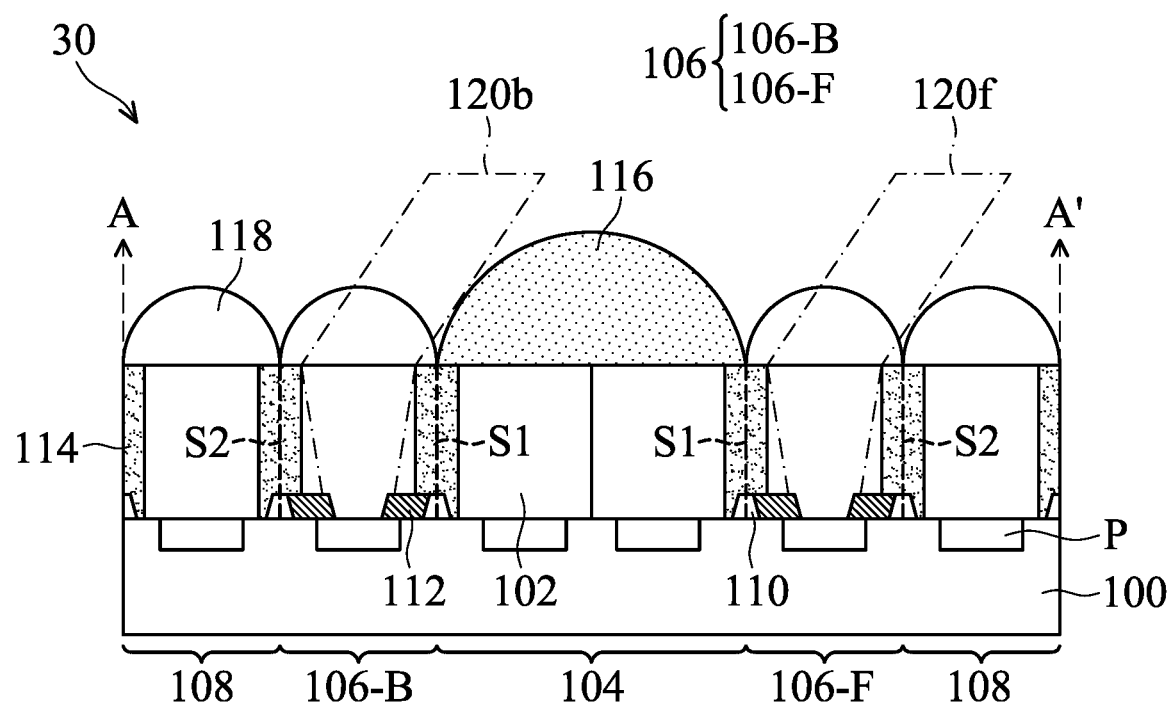

FIGS. 2A-2C are cross-sectional views of the image sensor shown in FIG. 1, wherein the cross-sectional views are obtained from the vertical plane containing line A-A' in FIG. 1. FIGS. 2A-2C illustrate image sensors 10, 20, and 30, respectively. The difference of the image sensors 10, 20, and 30 will be explained in detail later. Referring to FIG. 2A, in some embodiments, the image sensor 10 includes a group of autofocus sensor units 104, neighboring sensor units 106, and surrounding sensor units 108, as described above. Each of the group of autofocus sensor units 104, the neighboring sensor units 106, and the surrounding sensor units 108 includes a plurality of sensing portions P, color filer units 102, and micro-lenses (such as a first micro-lenses 116 and second micro-lenses 118). The plurality of sensing portions P may be embedded in a substrate 100. In some embodiments, the substrate 100 may be a single structure shared by all units of the image sensor 10.

In some embodiments, the substrate 100 may be, for example, a wafer or a chip, but the present disclosure is not limited thereto. In some embodiments, the substrate 100 may be a semiconductor substrate, for example, silicon substrate. Furthermore, in some embodiments, the semiconductor substrate may also be an elemental semiconductor including germanium, a compound semiconductor including gallium nitride (GaN), silicon carbide (SiC), gallium arsenide (GaAs), gallium phosphide (GaP), indium phosphide (InP), indium arsenide (InAs), and/or indium antimonide (InSb), an alloy semiconductor including silicon germanium (SiGe) alloy, gallium arsenide phosphide (GaAsP) alloy, aluminum indium arsenide (AlInAs) alloy, aluminum gallium arsenide (AlGaAs) alloy, gallium indium arsenide (GaInAs) alloy, gallium indium phosphide (GaInP) alloy, and/or gallium indium arsenide phosphide (GaInAsP) alloy, or the combinations thereof. In some embodiments, the substrate 100 may be a photoelectric conversion substrate, for example, silicon substrate or organic photoelectric conversion layer.

In other embodiments, the substrate 100 may also be a semiconductor on insulator (SOI) substrate. The semiconductor on insulator substrate may include a base plate, a buried oxide layer disposed on the base plate, and a semiconductor layer disposed on the buried oxide layer. Furthermore, the substrate 100 may be an N-type or a P-type conductive type.

In some embodiments, the substrate 100 may include various isolation elements (not shown) to define active regions, and to electrically isolate active region elements within or above the substrate 100. In some embodiments, isolation elements may include shallow trench isolation (STI) elements, local oxidation of silicon (LOCOS) elements, other suitable isolation elements, or the combinations thereof. In some embodiments, the formation of the isolation elements may include, for example, forming an insulating layer on the substrate 100, selectively etching the insulating layer and the substrate 100 to form trenches within the substrate 100, growing rich nitrogen-containing (such as silicon oxynitride) liners in the trenches, and filling insulating materials (such as silicon dioxide, silicon nitride, or silicon oxynitride) into the trenches with deposition processes, then performing annealing processes on the insulating materials in the trenches, and performing planarization processes on the substrate 100 to remove excessive insulating materials, so the insulating materials in the trenches are level with the top surface of the substrate 100.

In some embodiments, the substrate 100 may include various P-type doped regions and/or N-type doped regions (not shown) formed of, for example, ion implantation and/or diffusion process. In some embodiments, transistors, photodiodes, or the like, may be formed at the active regions, defined by the isolation elements.

As mentioned above, each of the group of autofocus sensor units 104, the neighboring sensor units 106, and the surrounding sensor units 108 include color filter units 102 disposed on the plurality of sensing portions P embedded within the substrate 100. According to some embodiments of the present disclosure, the neighboring sensor units 106 may be vertically and laterally adjoining the group of autofocus sensor units 104, and the surrounding sensor units 108 may be vertically and laterally adjoining the neighboring sensor units 106. In some embodiments, the height of the color filter units 102 may be approximately between 0.3 μm and 2.0 μm. In some embodiments, the color filter units 102 may be colored red, green, blue, white, or infrared, depending on the requirement of each sensor units, in which each of the underlying sensing portions P, such as photodiodes, may convert received light signals into electric signals for each of the group of autofocus sensor units 104, the neighboring sensor units 106, and the surrounding sensor units 108.

Refer to FIG. 2A. The image sensor 10 includes a light shielding structure 110 disposed on the substrate 100. As shown in FIGS. 3A-3E, 4A-4C, 5A-5D, and 6A-6D (which will be described later), the light shielding structure 110 is a single grid structure viewed from the top. From the top view, the light shielding structure 110 compartmentalizes each group of autofocus sensor units 104, each neighboring sensor unit 106, and each surrounding sensor unit 108. However, for clarity purpose, the light shielding structure 110 will be categorized into a first light shielding structure and a second light shielding structure (not separately labelled in the Figures). In the present embodiment, the first light shielding structure of the light shielding structure 110 is disposed between the group of autofocus sensor units 104 and the neighboring sensor units 106, and between the neighboring sensor units 106 and the surrounding sensor units 108. In some embodiments, the first light shielding structure of the light shielding structure 110 spans across the border of the group of autofocus sensor units 104, the neighboring sensor units 106, and the surrounding sensor units 108. In other word, the first light shielding structure of the light shielding structure 110 is disposed in a way shared by any two adjacent units (such as the group of autofocus sensor units 104 and the neighboring sensor units 106, or the neighboring sensor units 106 and the surrounding sensor units 108). The arrangement of the light shielding structure 110 may prevent one of the plurality of sensing portions P under one of the color filter units 102 to receive additional light from an adjacent color filter unit 102 of different colors, which may affect the accuracy of signals received. In some embodiments of the present disclosure, the height of the light shielding structure 110 may be approximately between 0.005 μm and 2.000 μm. In some embodiments, the material of the light shielding structure 110 may include opaque metals (such as tungsten (W), aluminum (Al)), opaque metal nitride (such as titanium nitride (TiN)), opaque metal oxide (such as titanium oxide (TiO)), other suitable materials, or a combination thereof, but the present disclosure is not limited thereto. The light shielding structure 110 may be formed by depositing a metal layer on the substrate 100 and then patterning the metal layer using photolithography and etching processes, but the present disclosure is not limited thereto.

Refer to FIG. 2A. A partition grid structure 114 is disposed over the light shielding structure 110. In some embodiments, the shape of the partition grid structure 114 may correspond to the shape of the light shielding structure 110. In some embodiments, the center line (not shown) of the partition grid structure 114 may define the border of each group of autofocus sensor units 104, each neighboring sensor unit 106, and each surrounding sensor unit 108. In some embodiments, in response to the inclined entry light reception, the light shielding structure 110 may be intentionally misaligned from the center line of the partition grid structure 114 on a lateral direction. Similarly, the joint portion of the subsequently formed micro-lenses may also be intentionally misaligned from the center line of the partition grid structure 114 on a lateral direction. Therefore, in some embodiments, the light shielding structure 110 is embedded within the partition grid structure 114. In other embodiments, the light shielding structure 110 may exceed beyond the boundary of the partition grid structure 114. Nevertheless, the inventor has found that the intentional misaligned arrangement may not sufficiently compensate the shielding effect caused by the structure of the group of autofocus sensor units 104. Therefore, an extra light shielding structure 112 is introduced in the present disclosure to address the above issue, which will be explained later. In some embodiments, the height of the partition grid structure 114 may be greater than or equal to the height of the light shielding structure 110 (the first light shielding structure and the second light shielding structure), depending on the design requirement of each of the image sensors 10, 20, and 30. According to some embodiments of the present disclosure, the partition grid structure 114 may have a lower refractive index than the color filter units 102. According to some embodiments of the present disclosure, the refractive index of the partition grid structure 114 is approximately between 1.00 and 1.99. When incident light enters the color filter units 102, the partition grid structure 114 may isolate light rays within the specific color filter unit 102 to serve as the light-trapping function. The material of the partition grid structure 114 may include a transparent dielectric material.

Refer to FIG. 2A. Micro-lenses are disposed correspondingly above the color filter units 102 of the group of autofocus sensor units 104, the neighboring sensor units 106, and the surrounding sensor units 108. In some embodiments of the present disclosure, as mentioned previously, the micro-lenses include the first micro-lenses 116 and the second micro-lenses 118. In some embodiments, each first micro-lens 116 corresponds to each group of autofocus sensor units 104, and each second micro-lens 118 corresponds to each neighboring sensor unit 106 and each surrounding sensor unit 108. In some embodiments, the first micro-lenses 116 and the second micro-lenses 118 serve to converge incident light into the plurality of sensing portions P in the substrate 100 through the color filter units 102. In some embodiments, the material of the first micro-lenses 116 and the second micro-lenses 118 may be a transparent material. For example, the material may include glass, epoxy resin, silicone resin, polyurethane, any other applicable material, or a combination thereof, but the present disclosure is not limited thereto. In some embodiments, the first micro-lenses 116 and the second micro-lenses 118 may be formed by a photoresist reflow method, a hot embossing method, any other applicable method, or a combination thereof. In some embodiments, the steps of forming the first micro-lenses 116 and the second micro-lenses 118 may include a spin-on coating process, a lithography process, an etching process, any other applicable processes, or a combination thereof, but the present disclosure is not limited thereto.

As mentioned, since each first micro-lens 116 covers more than one sensor unit and each second micro-lens 118 only covers a single sensor unit, the first micro-lens 116 has different structural dimensions than the second micro-lens 118. For example, the bottom area, the height, and/or the radius of curvature of the first micro-lens 116 may be different than those of the second micro-lens 118. Before incorporating the group of autofocus sensor units 104, the entire surface of the image sensor only contains micro-lenses of identical dimensions (such as the dimensions of the second micro-lens 118), in which a cycling effect may be generated. The cycling effect allows each sensor unit to receive a uniform amount of incident light, regardless of the light entry direction and/or angle. By integrating the group of autofocus sensor units 104, the sensitivity of the image sensor 10 may be enhanced, and the image focused may be detected and tracked. However, the structure of the first micro-lens 116 may undermine the cycling effect of the image sensor 10, resulting in poor uniformity of sensitivity.

For clarity and simplicity, each of the neighboring sensor units 106 may include a first side S1 and a second side S2. According to some embodiments of the present disclosure, the first side S1 is an interface (or border) between the group of autofocus sensor units 104 and the neighboring sensor units 106, and the second side S2 is an interface (or border) between the neighboring sensor units 106 and the surrounding sensor units 108. In some embodiments, the first side S1 is close to (or adjacent to) the group of autofocus sensor units 104, while the second side S2 is away from (or opposite from) the group of autofocus sensor units 104.

According to some embodiments of the present disclosure, when incident light is entered at an angle, for example, inclined toward the right, the neighboring sensor unit 106 on the right side of the group of autofocus sensor units 104 may be directly irradiated on. On the contrary, the neighboring sensor unit 106 on the left side of the group of autofocus sensor units 104 may be indirectly irradiated on, for example, with the first micro-lens 116 structure in between. In the embodiments of FIGS. 2A-2C, based on the direction of light entry, the neighboring sensor unit 106 on the right side of the group of autofocus sensor units 104, directly facing entry light before the group of autofocus sensor units 104, may be further considered as a frontside sensor unit 106-F, while the neighboring sensor unit 106 on the left side of the group of autofocus sensor units 104, receiving light through the group of autofocus sensor units 104 in a horizontal direction, may then be further considered as a backside sensor unit 106-B. As mentioned before, the first micro-lens 116 may have different structural dimensions than the second micro-lenses 118, the light received by the frontside sensor unit 106-F and the backside sensor unit 106-B may be affected by the structure of the first micro-lens 116. In other words, the amount of light received by the frontside sensor unit 106-F and the backside sensor unit 106-B may be different, causing poor uniformity in light reception between the frontside sensor unit 106-F and the backside sensor unit 106-B.

Refer to FIG. 2A. The height of the first micro-lens 116 of the image sensor 10 is substantially equal to the adjacent second micro-lenses 118. Under substantially the same heights, the first micro-lens 116 may have a larger radius of curvature than the second micro-lenses 118, due to its having a larger bottom area. As shown in FIG. 2A, the opposite ends of the first micro-lens 116 adjoin with the second micro-lens 118 on the frontside sensor unit 106-F and the second micro-lens 118 on the backside sensor unit 106-B, respectively. When incident light is entered at an angle (inclined toward the right), please note that, due to the structural characteristics of the first micro-lens 116, the adjoining portion of the first micro-lens 116 and the second micro-lens 118 on the backside sensor unit 106-B provides a larger surface area than the adjoining portion of the second micro-lens 118 on the frontside sensor unit 106-F and the adjacent second micro-lens 118 on the surrounding sensor unit 108 for light to irradiate on (due to a deeper joint seam between the first micro-lens 116 and the second micro-lens 118 than between two adjacent second micro-lenses 118). Therefore, the incident light 120*b* received by the backside sensor unit 106-B may be more than the incident light 120*f* received by the frontside sensor unit 106-F.

Refer to FIG. 2A. In order to overcome the poor uniformity of light reception, as mentioned previously, the extra light shielding structure 112 is introduced. However, for clarity purpose, the extra light shielding structure 112 will be categorized into a first extra light shielding structure and a second extra light shielding structure (not separately labelled in the Figures). The first extra light shielding structure of the extra light shielding structure 112 may be disposed on the first side S1 of the frontside sensor unit 106-F and the backside sensor unit 106-B, laterally extending from the first light shielding structure of the light shielding structure 110 toward the second side S2 of the corresponding neighboring sensor unit 106.

According to some embodiments of the present disclosure, the extra light shielding structure 112 (the first extra light shielding structure and the second extra light shielding structure) may act as an enlarged portion from the light shielding structure 110 (the first light shielding structure and the second light shielding structure), so the light shielding structure 110 and the extra light shielding structure 112 are a continuous structure. In other words, the light shielding structure 110 and the extra light shielding structure 112 are integrally formed together. In some embodiments, the light shielding structure 110 and the extra light shielding structure 112 may share the same material, then the same mask may be used to simultaneously form the light shielding structure 110 and the extra light shielding structure 112 without increasing additional cost. In other embodiments, the extra light shielding structure 112 may also have different materials than the light shielding structure 110, and different masks may be required for manufacture. According to some embodiments of the present disclosure, the extra light shielding structure 112 (the first extra light shielding structure and the second extra light shielding structure) may be arranged symmetrically around a center point of the group of the autofocus sensor units 104. As mentioned before, an actual image sensor may contain millions of groups of autofocus sensor units 104. The symmetrical feature of the extra light shielding structure 112 allows for more intuitive process procedure and mask design among the device surface. Please note that in FIG. 2A, the excessive portion of light received by the backside sensor unit 106-B is blocked by the first extra light shielding structure of the extra light shielding structure 112 of the backside sensor unit 106-B.

Therefore, the amount of light received by the frontside sensor unit 106-F and the backside sensor unit 106-B may be more uniform.

Refer to FIG. 2B. The height of the first micro-lens 116 of the image sensor 20 is significantly higher than the adjacent second micro-lenses 118. Using a fixed radius of curvature, the greater height of the first micro-lens 116 may increase the bottom area. As shown in FIG. 2B, the opposite ends of the first micro-lens 116 overlap the second micro-lens 118 on the frontside sensor unit 106-F and the second micro-lens 118 on the backside sensor unit 106-B, respectively. Please note that, due to the greater height and bottom area of the first micro-lens 116, the overlapping portion of the first micro-lens 116 and the second micro-lens 118 on the backside sensor unit 106-B provide a smaller surface area than the adjoining portion of the second micro-lens 118 on the frontside sensor unit 106-F and the adjacent second micro-lens 118 on the surrounding sensor unit 108 for light to irradiate on. Furthermore, shielding effect is generated, in which a portion of the incident light 120b is blocked by the first micro-lens 116, thereby reducing the amount of the incident light 120b received by the backside sensor unit 106-B. Therefore, the resulting amount of the incident light 120b received by the backside sensor unit 106-B may be less than the incident light 120f received by the frontside sensor unit 106-F.

Refer to FIG. 2B. In order to overcome the poor uniformity of amount of light received, the first extra light shielding structure of the extra light shielding structure 112 may be disposed on the second side S2 of the frontside sensor unit 106-F and the backside sensor unit 106-B, laterally extending from the first light shielding structure of the light shielding structure 110 toward the first side S1 of the corresponding neighboring sensor unit 106. The features of the extra light shielding structure 112 in the image sensor 20 are similar to those of the image sensor 10, and the details are not described again herein to avoid repetition. According to some embodiments of the present disclosure, the extra light shielding structure 112 (the first extra light shielding structure and the second extra light shielding structure) may also be arranged symmetrically around the center point of the group of the autofocus sensor units 104. The symmetrical feature of the extra light shielding structure 112 may enhance the uniformity of light reception between the frontside sensor unit 106-F and the backside sensor unit 106-B. Please note that in FIG. 2B, a portion of light received by the frontside sensor unit 106-F is blocked by the first extra light shielding structure of the extra light shielding structure 112 of the frontside sensor unit 106-F. Therefore, the amount of light received by the frontside sensor unit 106-F and the backside sensor unit 106-B may be more uniform.

Refer to FIG. 2C. An alternative design is illustrated in the image sensor 30, which combines the design concepts of the image sensor 10 and the image sensor 20. Whenever the group of autofocus sensor units 104 has a strong light absorption (sensitivity), a portion of light may be evenly distributed to the neighboring sensor units 106. Under the above circumstances, light reception at the frontside sensor unit 106-F and the backside sensor unit 106-B needs to be restricted further in order to regulate the energy difference. As shown in FIG. 2C, the first micro-lens 116 is arranged without overlapping with the second micro-lens 118 on the frontside sensor unit 106-F and the second micro-lens 118 on the backside sensor unit 106-B, such that light received by the frontside sensor unit 106-F and the backside sensor unit 106-B may be substantially uniform. In other words, the incident light 120f and the incident light 120b may be irradiated upon relatively equal amount of the surface area. However, it can be noticed that a slight change in the first micro-lens 116 structure will affect the uniformity of light received between the frontside sensor unit 106-F and the backside sensor unit 106-B. For example, if the height of the first micro-lens 116 slightly increased, a portion of the incident light 120b will be blocked, causing the backside sensor unit 106-B to receive less amount of light than the frontside sensor unit 106-F. On the contrary, if the height of the first micro-lens 116 slightly decreased, the incident light 120b may be irradiated on larger surface area, causing the backside sensor unit 106-B to receive more amount of light than the frontside sensor unit 106-F. Therefore, it may be very difficult to maintain the uniformity of light reception between the frontside sensor unit 106-F and the backside sensor unit 106-B.

Refer to FIG. 2C. In order to overcome the energy difference and the difficulty of maintaining the uniformity of light reception, the first extra light shielding structure of the extra light shielding structure 112 may be disposed on both the first side S1 and the second side S2 of the frontside sensor unit 106-F and the backside sensor unit 106-B, laterally extending from the first light shielding structure of the light shielding structure 110 respectively toward the second side S2 and the first side S1 of the corresponding neighboring sensor unit 106. The features of the first extra light shielding structure of the extra light shielding structure 112 in the image sensor 30 are similar to those of the image sensors 10 and 20, and the details are not described again herein to avoid repetition. According to some embodiments of the present disclosure, the extra light shielding structure 112 (the first extra light shielding structure and the second extra light shielding structure) may be arranged symmetrically around the center point of the group of the autofocus sensor units 104. The symmetrical feature of the extra light shielding structure 112 may enhance the uniformity of light reception between the frontside sensor unit 106-F and the backside sensor unit 106-B. Therefore, the image sensor 30 may be a suitable option depending on the circuitry requirement.

According to some embodiments of the present disclosure, FIGS. 2A-2C illustrate three different ways to arrange the first extra light shielding structure of the extra light shielding structure 112 on the image sensors 10, 20, and 30, respectively. The choice of design may be determined based on simulation result, depending on the circuitry requirements and the nature of the entry light specified. It is appreciated that when the first extra light shielding structure of the extra light shielding structure 112 does not extend sufficiently from the first side S1 and/or the second side S2 of each neighboring sensor unit 106, excessive light received may not be properly blocked, causing the uniformity of sensitivity to remain poor on the image sensors 10, 20, and 30. However, if the first extra light shielding structure of the extra light shielding structure 112 extends too much from the first side S1 and/or the second side S2 of each neighboring sensor unit 106, the plurality of sensing portions P embedded within the substrate 100 may not be able to function properly (to receive light signals properly), which may compromise the overall performance of the image sensors 10, 20, and 30. Therefore, a certain amount of the total area of each neighboring sensor unit 106 needs to remain "unshielded", so light may be received by the plurality of sensing portions P within the substrate 100. In some embodiments of the present disclosure, the extra light shielding structure 112 (the first extra light shielding structure and the second extra light shielding structure) may cover approximately between 0% and 50% of the total area of each neighboring sensor unit 106.

FIGS. 3A-3E are top views of the image sensors, wherein the group of autofocus sensor units 104, the neighboring sensor units 106, the light shielding structure 110 (the first light shielding structure and the second light shielding structure), and the extra light shielding structure 112 (the first extra light shielding structure and the second extra light shielding structure) are illustrated, while the color filter units 102, the surrounding sensor units 108, the partition grid structure 114, and the micro-lenses (the first micro-lenses 116 and the second micro-lenses 118) are omitted, according to some embodiments of the present disclosure. In some embodiments, the shape of the extra light shielding structure 112 (when viewed from top) may vary within the limitation of manufacture. According to some embodiments of the present disclosure, various shape designs are appropriate, as long as the extra light shielding structure 112 is arranged symmetrically around the center point of the group of the autofocus sensor units 104, and the coverage area is approximately between 0% and 50% of the total area of each neighboring sensor unit 106. FIGS. 3A-3E illustrate several examples of how the shape of the extra light shielding structure 112 may alter, but the present disclosure is not limited thereto.

Refer to FIGS. 3A-3E. For clarity and simplicity, only the first extra light shielding structure of the extra light shielding structure 112 is illustrated, which is extended only from the first side S1 of each neighboring sensor unit 106 toward the second side S2 of the corresponding neighboring sensor unit 106. In these embodiments, the illustration may be focused on the x-axis units and the y-axis units, namely neighboring sensor units 106*b*, 106*c*, 106*e*, 106*f*, 106*h*, 106*i*, 106*k*, and 106*l*. Diagonal units are not considered at this point.

Figure 3A:
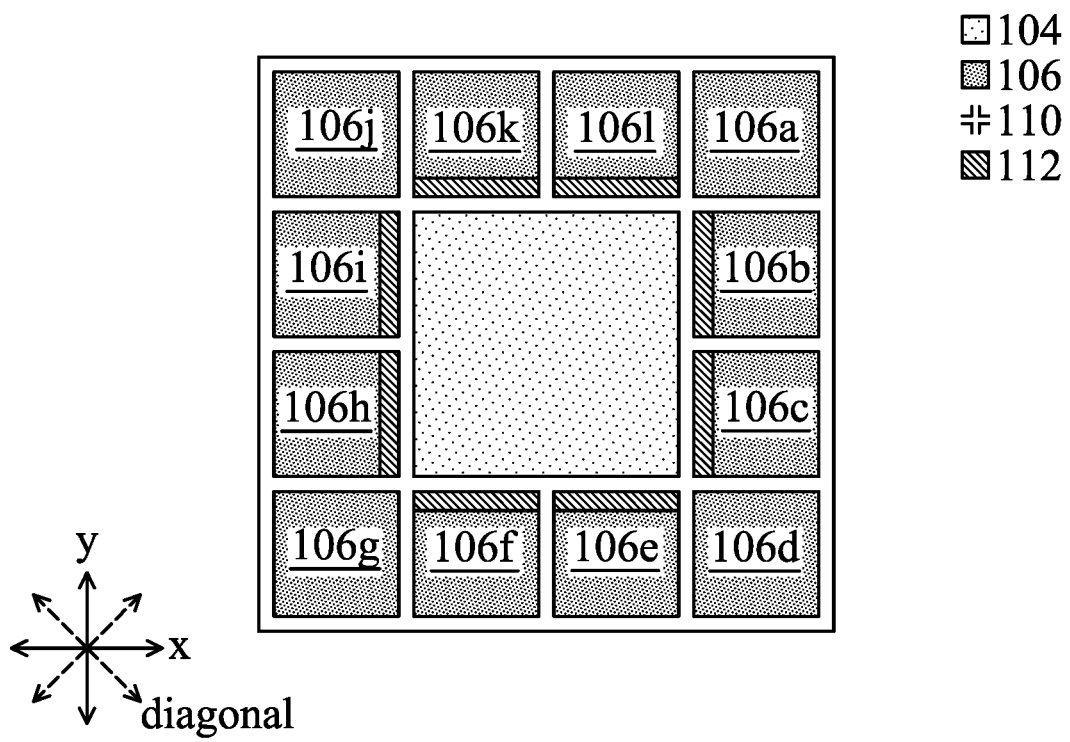
FIGS. 3A-3E are top views of image sensors, illustrated before manufacturing color filter units and micro-lenses, according to some embodiments of the present disclosure.

In some embodiments, FIG. 3A illustrates the first extra light shielding structure of the extra light shielding structure 112 in rectangular shape. As shown in FIG. 3A, the first extra light shielding structure of the extra light shielding structure 112 may be laterally extending from the first light shielding structure of the light shielding structure 110 on the first side S1 of the neighboring sensor units 106*b*, 106*c*, 106*e*, 106*f*, 106*h*, 106*i*, 106*k*, and 106*l*. According to some embodiments of the present disclosure, the first extra light shielding structure of the extra light shielding structure 112 may be arranged symmetrically around the center point of the group of the autofocus sensor units 104.

Figure 3B:
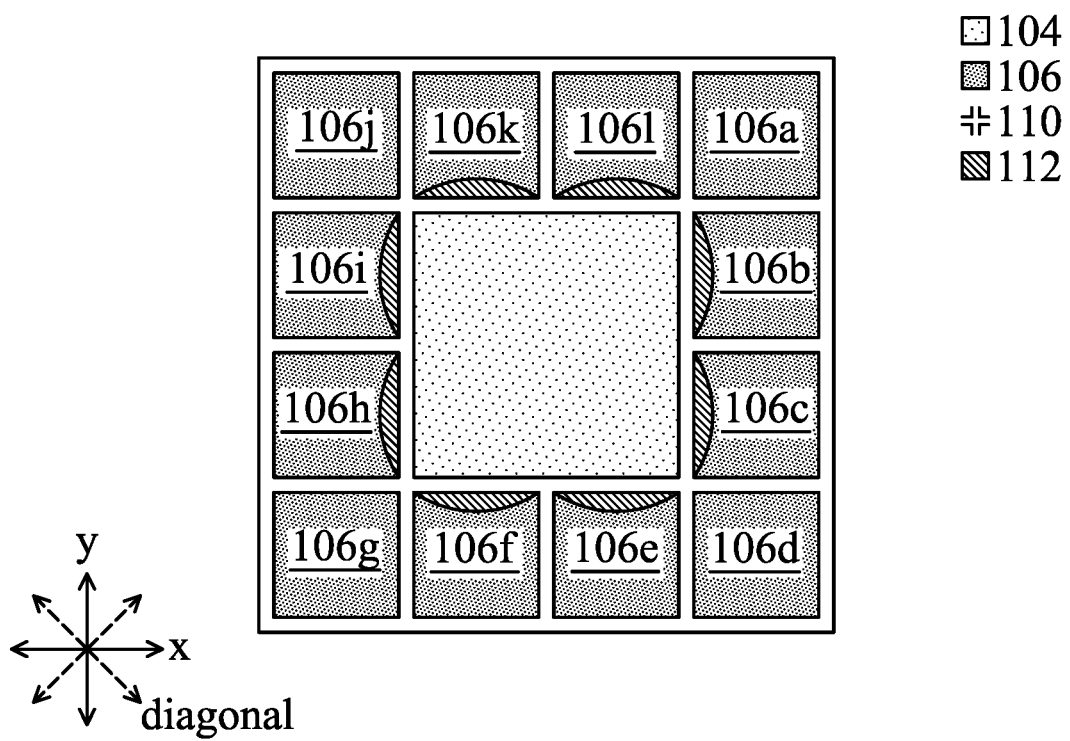

In some embodiments, FIG. 3B illustrates the first extra light shielding structure of the extra light shielding structure 112 in partial elliptical shape. As shown in FIG. 3B, the first extra light shielding structure of the extra light shielding structure 112 may be laterally extending from the first light shielding structure of the light shielding structure 110 on the first side S1 of the neighboring sensor units 106*b*, 106*c*, 106*e*, 106*f*, 106*h*, 106*i*, 106*k*, and 106*l*. According to some embodiments of the present disclosure, the first extra light shielding structure of the extra light shielding structure 112 may be arranged symmetrically around the center point of the group of the autofocus sensor units 104.

Figure 3C:
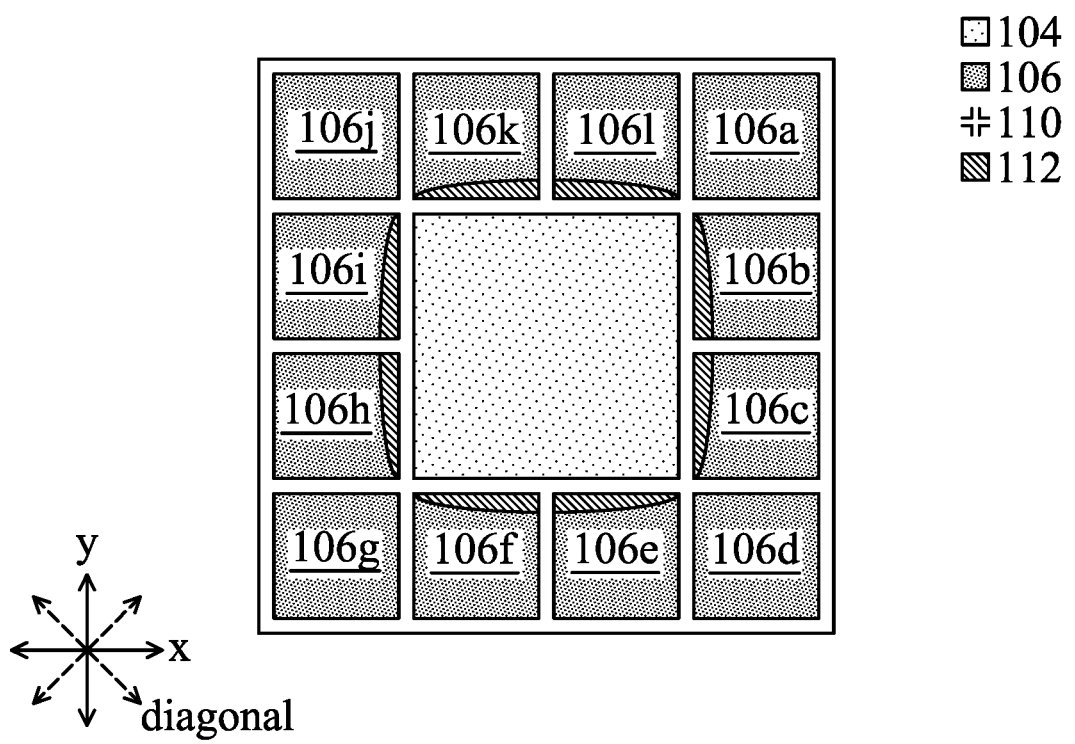

In some embodiments, FIG. 3C illustrates the first extra light shielding structure of the extra light shielding structure 112 in partial elliptical shape across two or more neighboring sensor units 106. As shown in FIG. 3C, the first extra light shielding structure of the extra light shielding structure 112 may be laterally extending from the first light shielding structure of the light shielding structure 110 on the first side S1 of the neighboring sensor units 106*b*, 106*c*, 106*e*, 106*f*, 106*h*, 106*i*, 106*k*, and 106*l*. According to some embodiments of the present disclosure, the first extra light shielding structure of the extra light shielding structure 112 may be arranged symmetrically around the center point of the group of the autofocus sensor units 104.

Figure 3D:
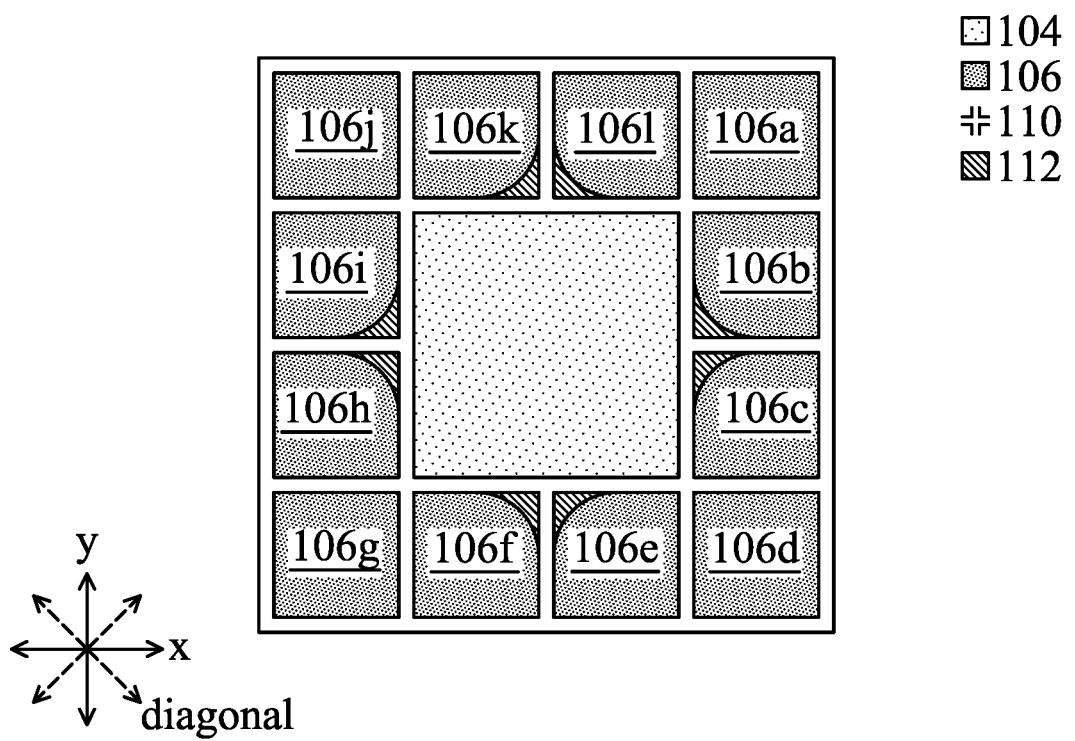

In some embodiments, FIG. 3D illustrates the first extra light shielding structure of the extra light shielding structure 112 in arc shape. As shown in FIG. 3D, the first extra light shielding structure of the extra light shielding structure 112 may be laterally extending from the first light shielding structure of the light shielding structure 110 on the first side S1 of the neighboring sensor units 106*b*, 106*c*, 106*e*, 106*f*, 106*h*, 106*i*, 106*k*, and 106*l*. According to some embodiments of the present disclosure, the first extra light shielding structure of the extra light shielding structure 112 may be arranged symmetrically around the center point of the group of the autofocus sensor units 104.

Figure 3E:
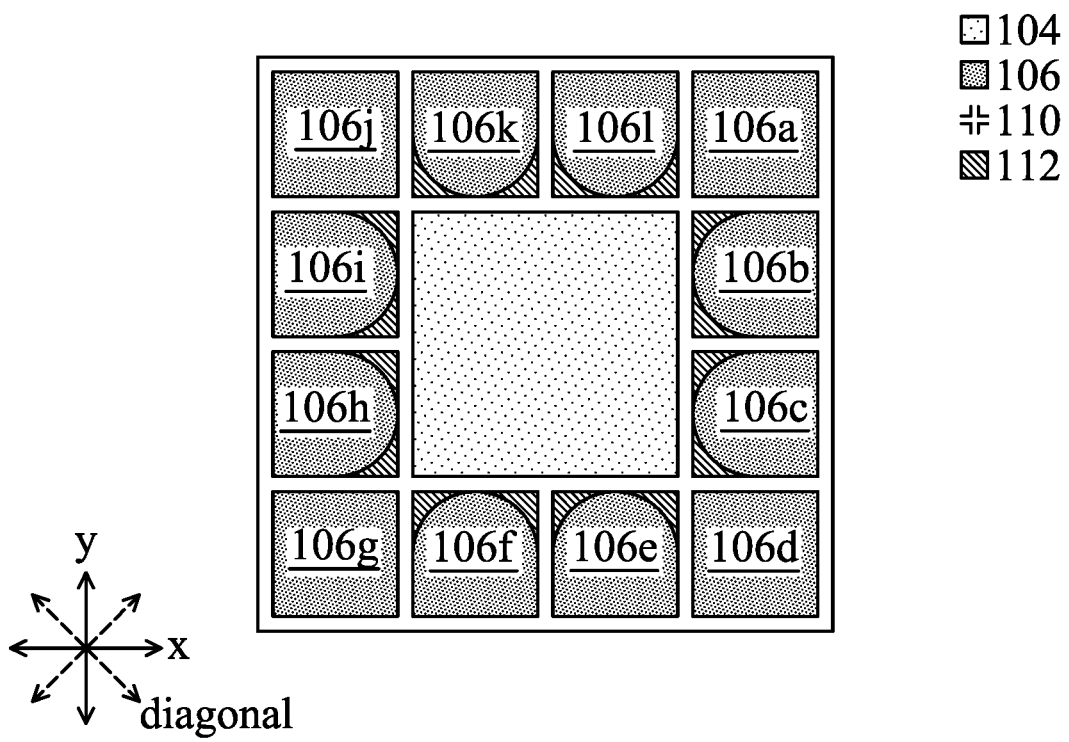

In some embodiments, FIG. 3E illustrates the first extra light shielding structure of the extra light shielding structure 112 in U-shape. As shown in FIG. 3E, the first extra light shielding structure of the extra light shielding structure 112 may be laterally extending from the first light shielding structure of the light shielding structure 110 on the first side S1 of the neighboring sensor units 106*b*, 106*c*, 106*e*, 106*f*, 106*h*, 106*i*, 106*k*, and 106*l*. According to some embodiments of the present disclosure, the first extra light shielding structure of the extra light shielding structure 112 may be arranged symmetrically around the center point of the group of the autofocus sensor units 104.

Figure 4A:
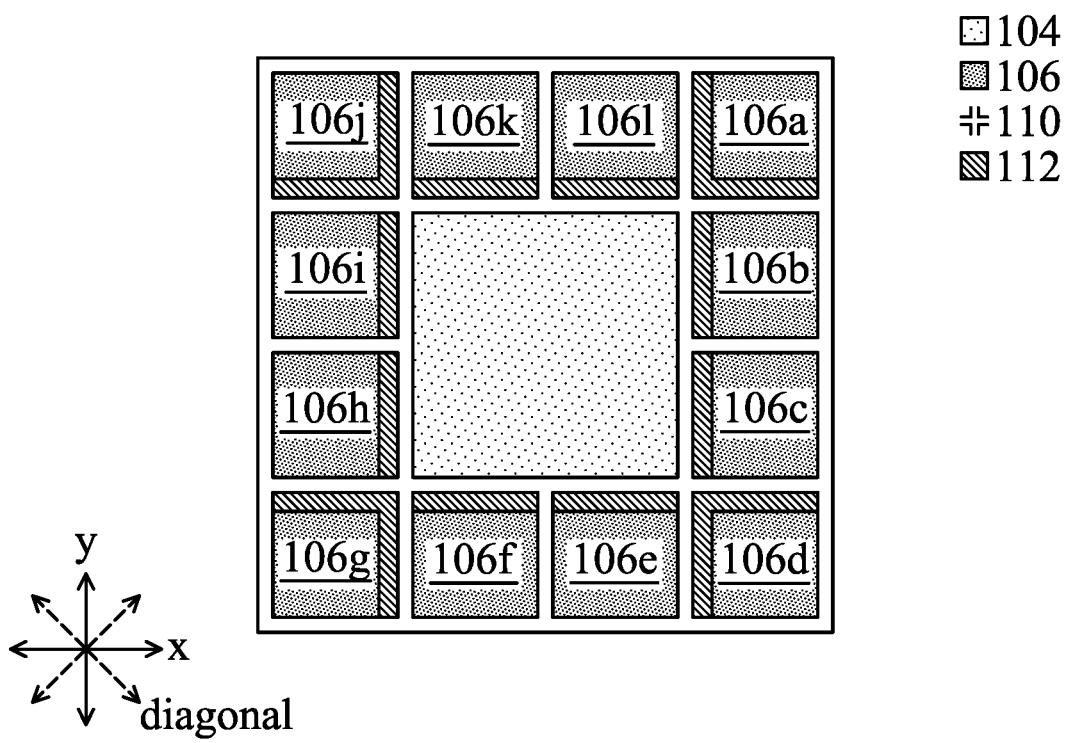
FIGS. 4A-4C are top views of image sensors, illustrated before manufacturing color filter units and micro-lenses, according to some embodiments of the present disclosure.
Figure 4B:
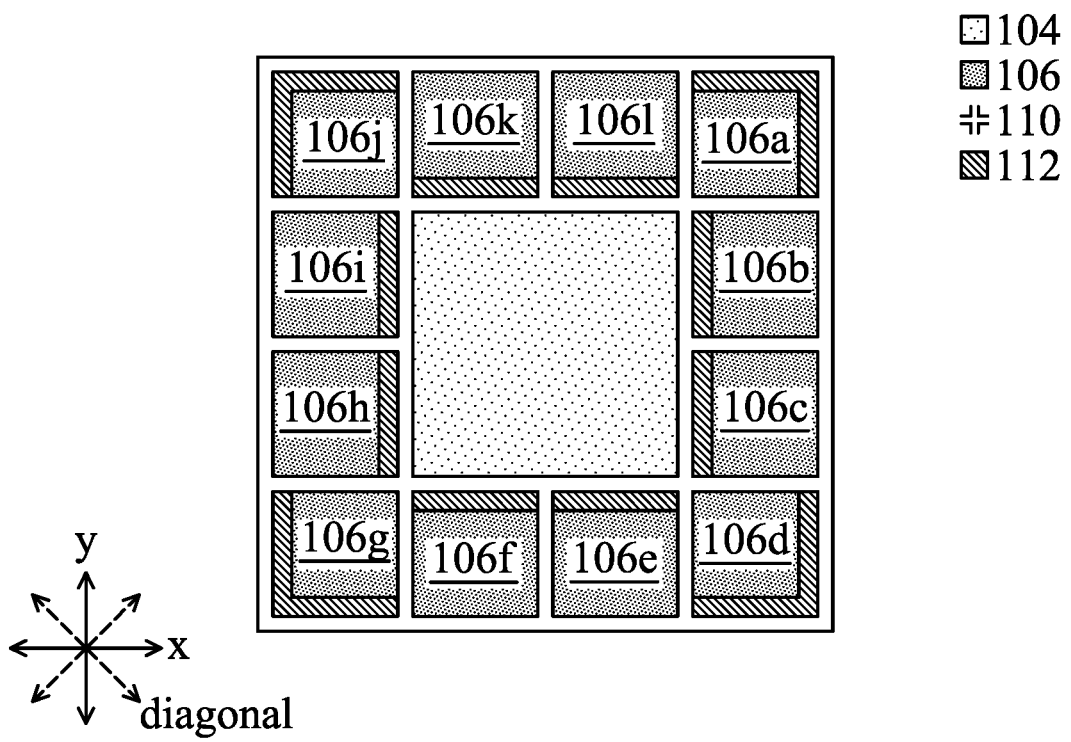
Figure 4C:
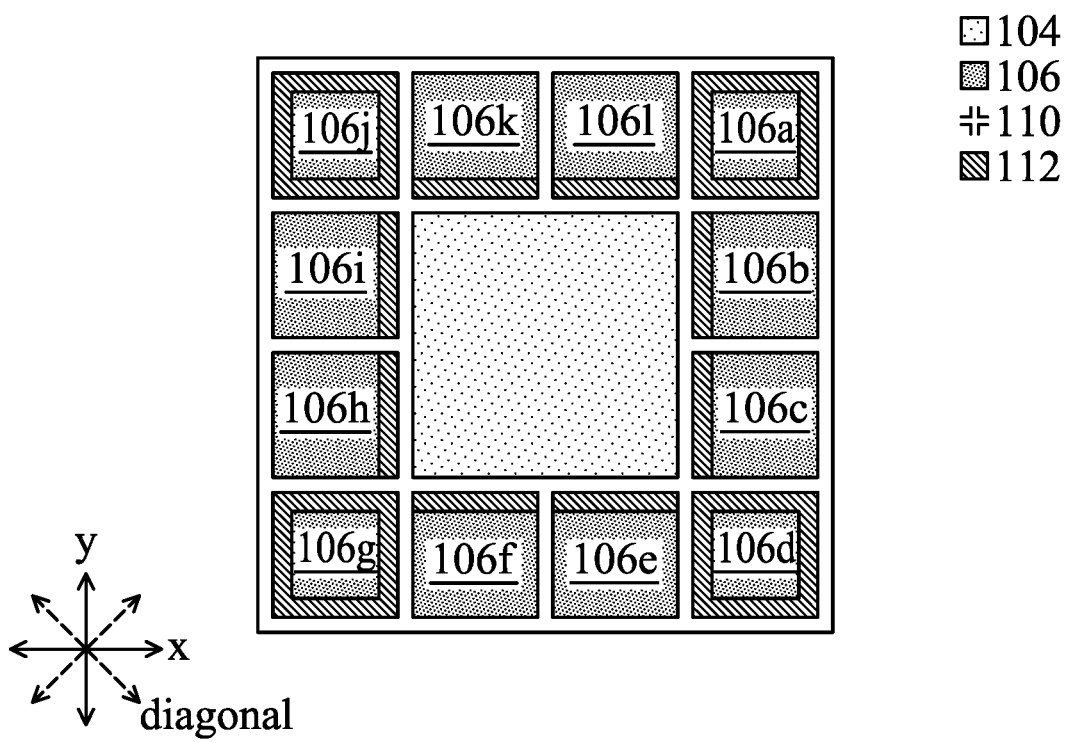

FIGS. 4A-4C are top views of the image sensors, wherein the group of autofocus sensor units 104, the neighboring sensor units 106, the light shielding structure 110 (the first light shielding structure and the second light shielding structure), and the extra light shielding structure 112 (the first extra light shielding structure and the second extra light shielding structure) are illustrated, while the color filter units 102, the surrounding sensor units 108, the partition grid structure 114, and the micro-lenses (the first micro-lenses 116 and the second micro-lenses 118) are omitted, according to some embodiments of the present disclosure. In some embodiments, the second light shielding structure of the light shielding structure 110 may be arranged differently from the first light shielding structure of the light shielding structure 110. According to some embodiments of the present disclosure, the second light shielding structure of the light shielding structure 110 has four sides surrounding the neighboring sensor units 106 diagonally adjoining the group of autofocus sensor units 104 from top view, namely the neighboring sensor units 106*a*, 106*d*, 106*g*, and 106*j* (also referred to as the diagonal units). In the present embodiment, the second light shielding structure of the light shielding structure 110 has a first corner close to the group of autofocus sensor units 104 and a second corner away from the group of the group of autofocus sensor units 104. Two of the four sides intersect at the first corner, and another two of the four sides intersect at the second corner.

In some embodiments, the second extra light shielding structure of the extra light shielding structure 112 may be arranged differently from the first extra light shielding structure of the extra light shielding structure 112. According to some embodiments of the present disclosure, the second extra light shielding structure of the extra light shielding structure 112 is laterally extending from the second light shielding structure of the light shielding structure 110 and disposed on at least two of the four sides from top view. In other words, each of the x-axis units and the y-axis units has one side (the first side S1) adjacent to the group of autofocus sensor units 104, while each of the diagonal units has one corner (the first corner) adjacent to the group of autofocus sensor units 104.

In some embodiments, FIG. 4A illustrates the image sensor designed on the basis of the one described in FIG. 3A. As shown in FIG. 4A, the second extra light shielding structure of the extra light shielding structure 112 may be disposed on the two sides intersecting at the first corner, laterally extending from the second light shielding structure of the light shielding structure 110 toward the other two sides interesting at the second corner of the corresponding second light shielding structure of the light shielding structure 110. According to some embodiments of the present disclosure, the second extra light shielding structure of the extra light shielding structure 112 may be arranged symmetrically around the center point of the group of the autofocus sensor units 104.

In some embodiments, FIG. 4B illustrates the image sensor designed on the basis of the one described in FIG. 3A. As shown in FIG. 4B, the second extra light shielding structure of the extra light shielding structure 112 may be disposed on the other two sides intersecting at the second corner, laterally extending from the second light shielding structure of the light shielding structure 110 toward the two sides interesting at the first corner of the corresponding second light shielding structure of the light shielding structure 110. According to some embodiments of the present disclosure, the second extra light shielding structure of the extra light shielding structure 112 may be arranged symmetrically around the center point of the group of the autofocus sensor units 104.

In some embodiments, FIG. 4C illustrates the image sensor designed on the basis of the one described in FIG. 3A. As shown in FIG. 4C, the second extra light shielding structure of the extra light shielding structure 112 may be disposed on the four sides of the second light shielding structure of the light shielding structure 110, laterally extending internally within the corresponding second light shielding structure of the light shielding structure 110. According to some embodiments of the present disclosure, the second extra light shielding structure of the extra light shielding structure 112 may be arranged symmetrically around the center point of the group of the autofocus sensor units 104.

FIGS. 5A-5D are top views of the image sensors, wherein the group of autofocus sensor units 104, the neighboring sensor units 106, the light shielding structure 110 (the first light shielding structure and the second light shielding structure), and the extra light shielding structure 112 (the first extra light shielding structure and the second extra light shielding structure) are illustrated, while the color filter units 102, the surrounding sensor units 108, the partition grid structure 114, and the micro-lenses (the first micro-lenses 116 and the second micro-lenses 118) are omitted, according to some embodiments of the present disclosure. As mentioned previously, the second light shielding structure of the light shielding structure 110 has four sides surrounding the diagonal units. In the present embodiment, the second light shielding structure of the light shielding structure 110 has a first corner close to the group of autofocus sensor units 104 and a second corner away from the group of the group of autofocus sensor units 104. Two of the four sides intersect at the first corner, and another two of the four sides intersect at the second corner.

Figure 5A:
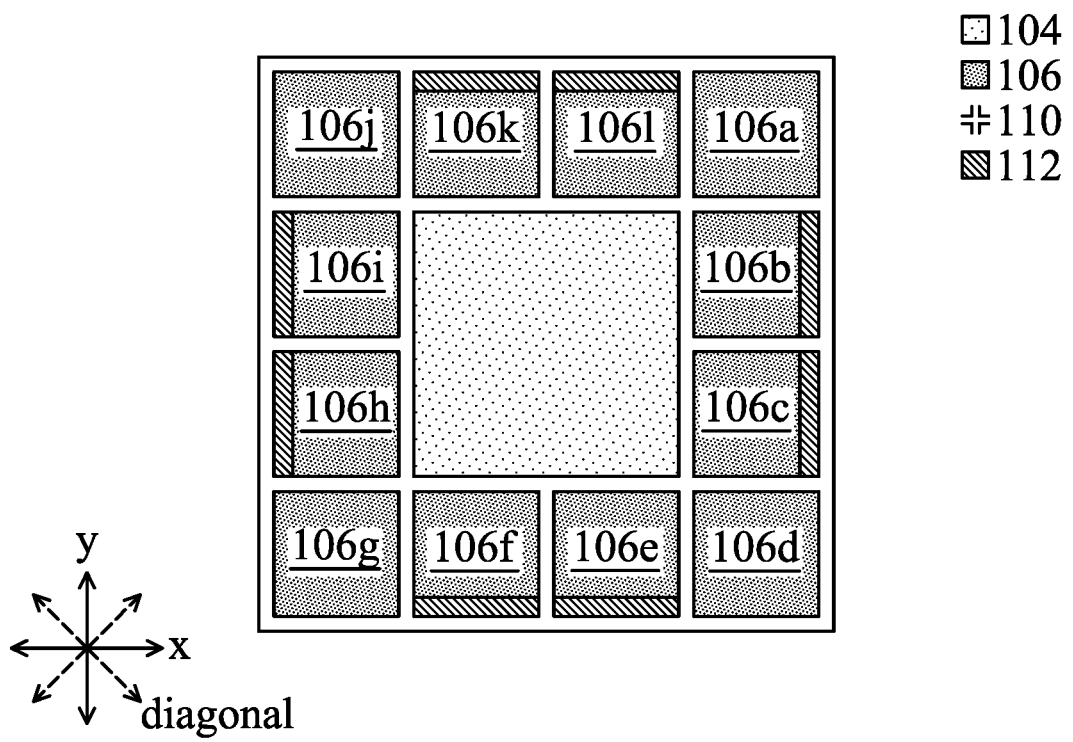
FIGS. 5A-5D are top views of image sensors, illustrated before manufacturing color filter units and micro-lenses, according to some embodiments of the present disclosure.

As shown in FIG. 5A, the first extra light shielding structure of the extra light shielding structure 112 may be disposed on the second side S2 of the x-axis units and the y-axis units, laterally extending from the first light shielding structure of the light shielding structure 110 toward the first side S1 of the corresponding neighboring sensor units. According to some embodiments of the present disclosure, the first extra light shielding structure of the extra light shielding structure 112 may be arranged symmetrically around the center point of the group of the autofocus sensor units 104.

Figure 5B:
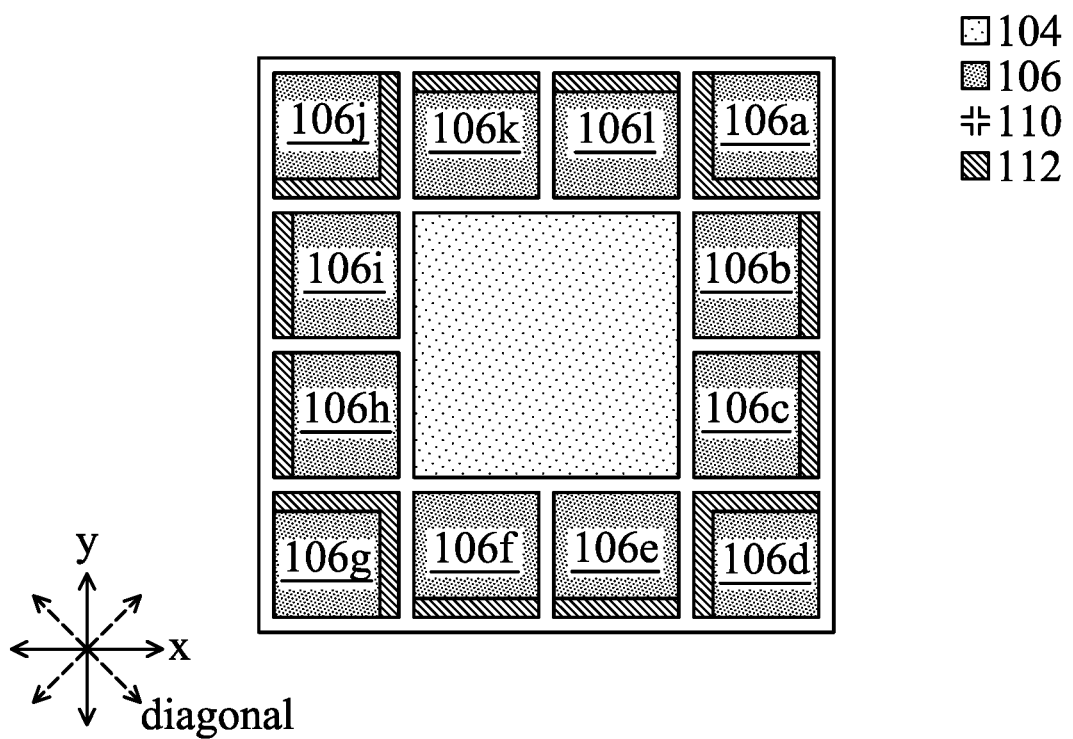

In some embodiments, FIG. 5B illustrates the image sensor designed on the basis of the one described in FIG. 5A. According to some embodiments of the present disclosure, the second extra light shielding structure of the extra light shielding structure 112 is laterally extending from the second light shielding structure of the light shielding structure 110 and disposed on at least two of the four sides from top view. As shown in FIG. 5B, the second extra light shielding structure of the extra light shielding structure 112 may be disposed on the two sides intersecting at the first corner, laterally extending from the second light shielding structure of the light shielding structure 110 toward the other two sides interesting at the second corner of the corresponding second light shielding structure of the light shielding structure 110. According to some embodiments of the present disclosure, the second extra light shielding structure of the extra light shielding structure 112 may be arranged symmetrically around the center point of the group of the autofocus sensor units 104.

Figure 5C:
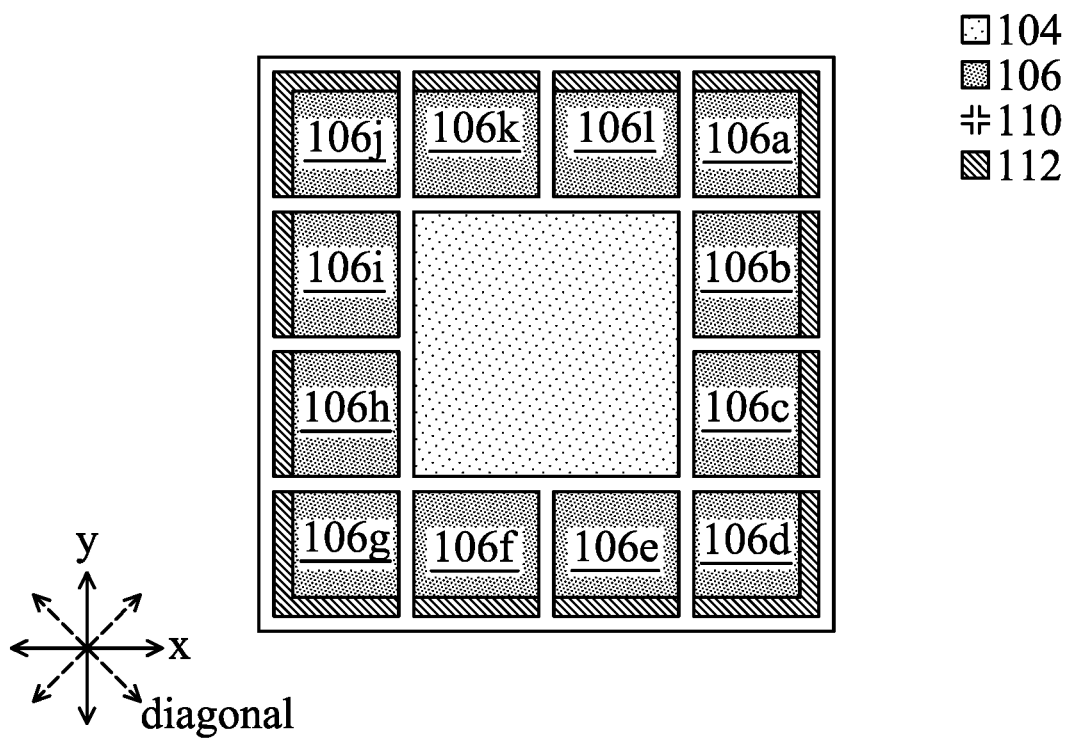

In some embodiments, FIG. 5C illustrates the image sensor designed on the basis of the one described in FIG. 5A. As shown in FIG. 5C, the second extra light shielding structure of the extra light shielding structure 112 may be disposed on the other two sides intersecting at the second corner, laterally extending from the second light shielding structure of the light shielding structure 110 toward the two sides interesting at the first corner of the corresponding second light shielding structure of the light shielding structure 110. According to some embodiments of the present disclosure, the second extra light shielding structure of the extra light shielding structure 112 may be arranged symmetrically around the center point of the group of the autofocus sensor units 104.

Figure 5D:
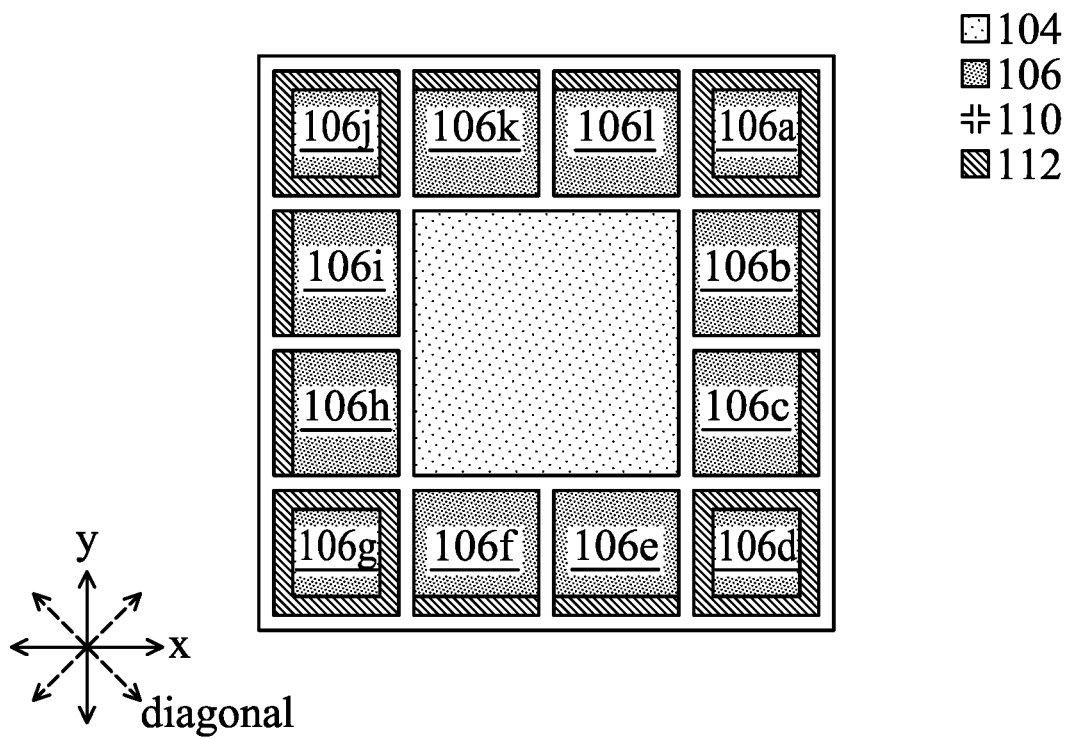

In some embodiments, FIG. 5D illustrates the image sensor designed on the basis of the one described in FIG. 5A. As shown in FIG. 5D, the second extra light shielding structure of the extra light shielding structure 112 may be disposed on the four sides of the second light shielding structure of the light shielding structure 110, laterally extending internally within the corresponding second light shielding structure of the light shielding structure 110. According to some embodiments of the present disclosure, the second extra light shielding structure of the extra light shielding structure 112 may be arranged symmetrically around the center point of the group of the autofocus sensor units 104.

FIGS. 6A-6D are top views of the image sensors, wherein the group of autofocus sensor units 104, the neighboring sensor units 106, the light shielding structure 110 (the first light shielding structure and the second light shielding structure), and the extra light shielding structure 112 (the first extra light shielding structure and the second extra light shielding structure) are illustrated, while the color filter units 102, the surrounding sensor units 108, the partition grid structure 114, and the micro-lenses (the first micro-lenses 116 and the second micro-lenses 118) are omitted, according to some embodiments of the present disclosure. As mentioned previously, the second light shielding structure of the light shielding structure 110 has four sides surrounding the diagonal units. In the present embodiment, the second light shielding structure of the light shielding structure 110 has a first corner close to the group of autofocus sensor units 104 and a second corner away from the group of the group of autofocus sensor units 104. Two of the four sides intersect at the first corner, and another two of the four sides intersect at the second corner.

Figure 6A:
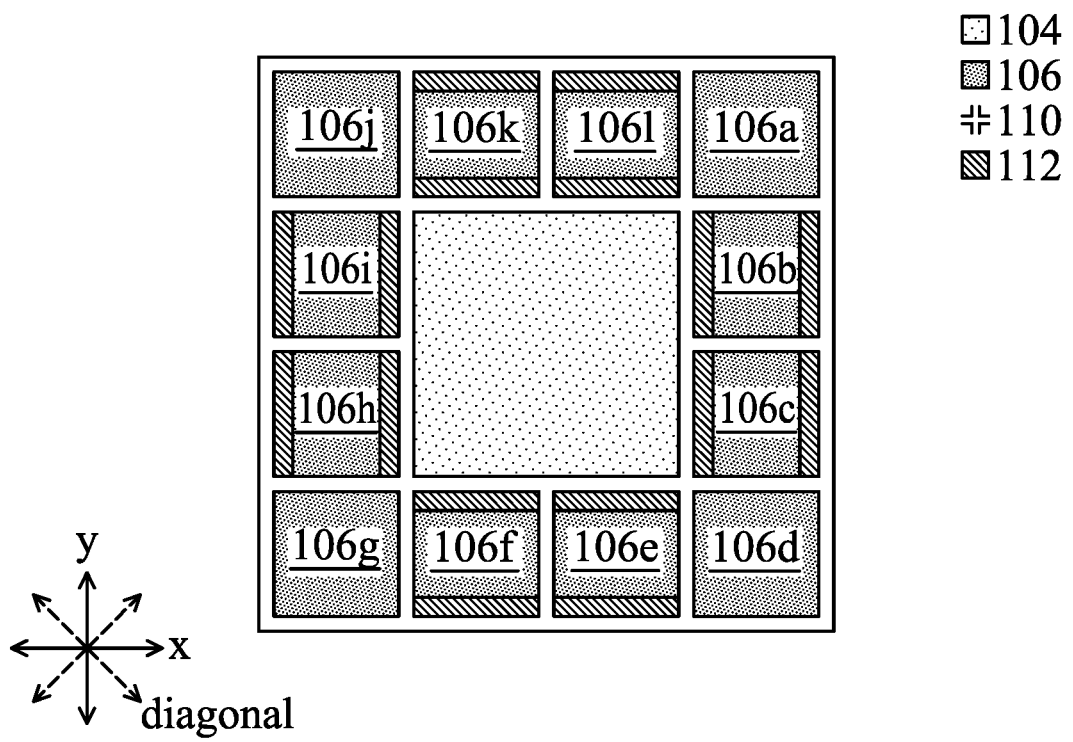
FIGS. 6A-6D are top views of image sensors, illustrated before manufacturing color filter units and micro-lenses, according to some embodiments of the present disclosure.

As shown in FIG. 6A, the first extra light shielding structure of the extra light shielding structure 112 may be disposed on both the first side S1 and the second side S2 of the x-axis units and the y-axis units, laterally extending from the first light shielding structure of the light shielding structure 110 respectively toward the second side S2 and the first side S1 of the corresponding neighboring sensor units. According to some embodiments of the present disclosure, the first extra light shielding structure of the extra light shielding structure 112 may be arranged symmetrically around the center point of the group of the autofocus sensor units 104.

Figure 6B:
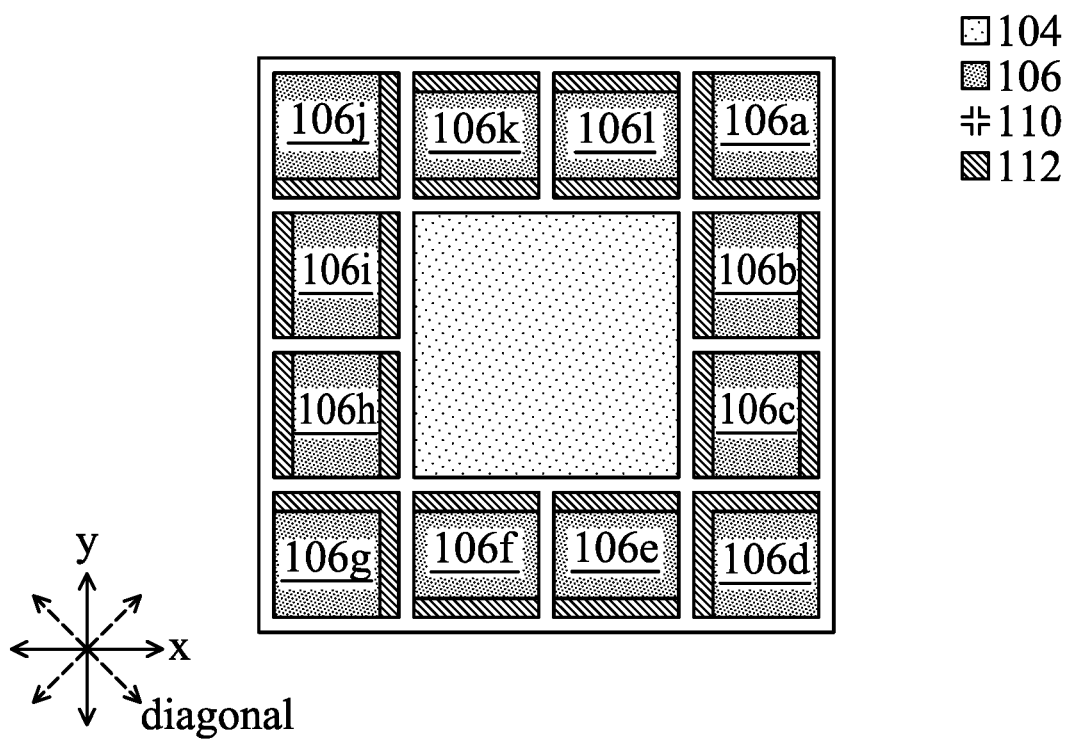

In some embodiments, FIG. 6B illustrates the image sensor designed on the basis of the one described in FIG. 6A. According to some embodiments of the present disclosure, the second extra light shielding structure of the extra light shielding structure 112 is laterally extending from the second light shielding structure of the light shielding structure 110 and disposed on at least two of the four sides from top view. As shown in FIG. 6B, the second extra light shielding structure of the extra light shielding structure 112 may be disposed on the two sides intersecting at the first corner, laterally extending from the second light shielding structure of the light shielding structure 110 toward the other two sides interesting at the second corner of the corresponding second light shielding structure of the light shielding structure 110. According to some embodiments of the present disclosure, the second extra light shielding structure of the extra light shielding structure 112 may be arranged symmetrically around the center point of the group of the autofocus sensor units 104.

Figure 6C:
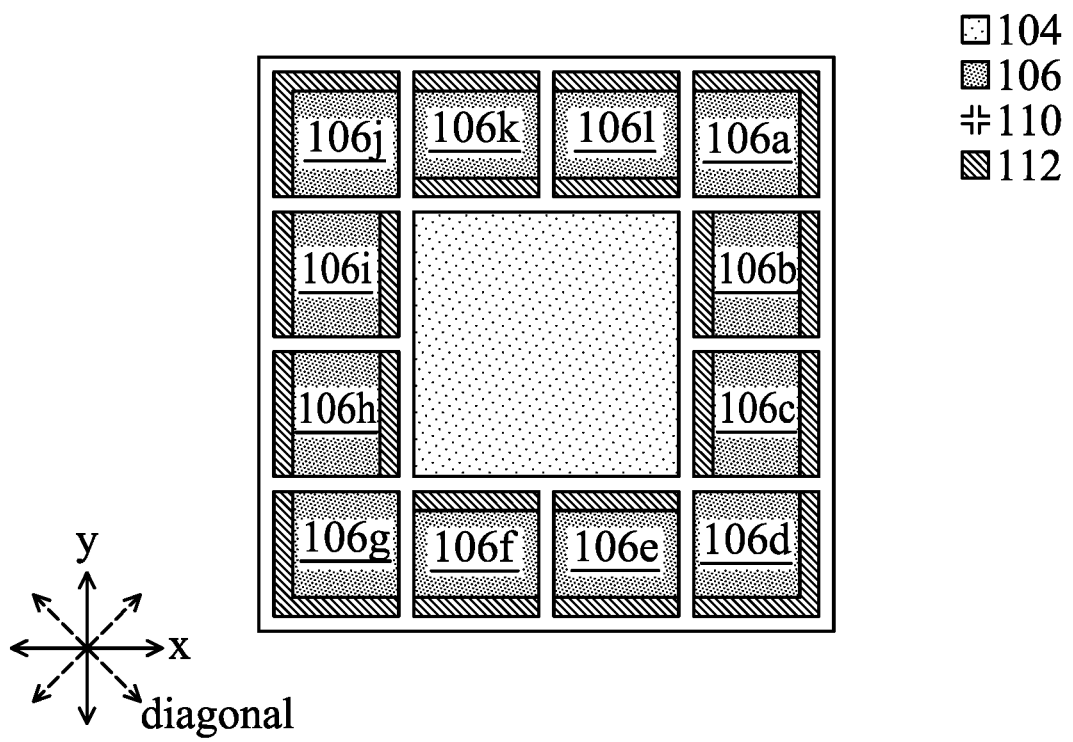

In some embodiments, FIG. 6C illustrates the image sensor designed on the basis of the one described in FIG. 6A. As shown in FIG. 6C, the second extra light shielding structure of the extra light shielding structure 112 may be disposed on the other two sides intersecting at the second corner, laterally extending from the second light shielding structure of the light shielding structure 110 toward the two sides interesting at the first corner of the corresponding second light shielding structure of the light shielding structure 110. According to some embodiments of the present disclosure, the second extra light shielding structure of the extra light shielding structure 112 may be arranged symmetrically around the center point of the group of the autofocus sensor units 104.

Figure 6D:
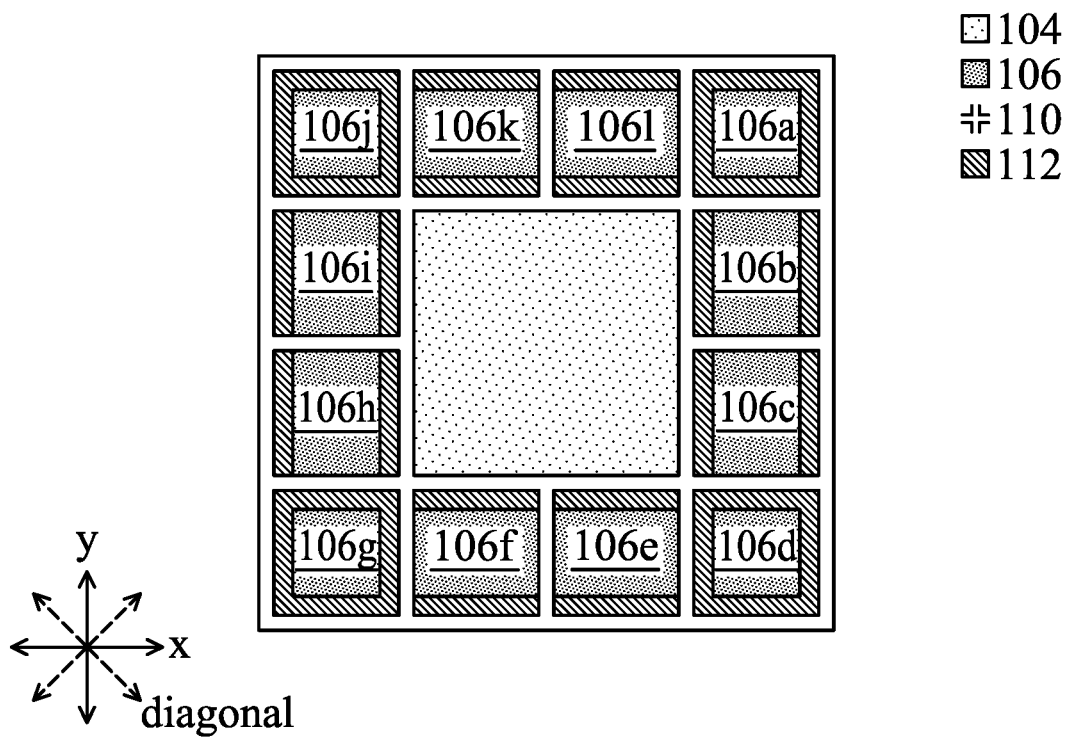

In some embodiments, FIG. 6D illustrates the image sensor designed on the basis of the one described in FIG. 6A. As shown in FIG. 6D, the second extra light shielding structure of the extra light shielding structure 112 may be disposed on the four sides of the second light shielding structure of the light shielding structure 110, laterally extending internally within the corresponding second light shielding structure of the light shielding structure 110. According to some embodiments of the present disclosure, the second extra light shielding structure of the extra light shielding structure 112 may be arranged symmetrically around the center point of the group of the autofocus sensor units 104.

In summary, as shown in FIGS. 2A-2C, according to some embodiments, an image sensor of the present disclosure includes a group of autofocus sensor units 104; neighboring sensor units 106 adjacent to and surrounding the group of autofocus sensor units 104, wherein each of the neighboring sensor units 106 has a first side S1 close to the group of autofocus sensor units 104, and a second side S2 away from the group of autofocus sensor units 104. The image sensor further includes a first light shielding structure disposed between the group of autofocus sensor units 104 and the neighboring sensor units 106; a first extra light shielding structure laterally extending from the first light shielding structure and disposed on at least one of the first side S1 and the second side S2 of one or more of the neighboring sensor units 106.

As shown in FIGS. 2A-2C, according to some embodiments, an image sensor of the present disclosure includes a group of autofocus sensor units 104; neighboring sensor units 106 adjacent to and surrounding the group of autofocus sensor units 104, wherein each of the neighboring sensor units 106 has a first side S1 close to the group of autofocus sensor units 104, and a second side S2 away from the group of autofocus sensor units 104. The image sensor further includes a first light shielding structure disposed between the group of autofocus sensor units 104 and the neighboring sensor units 106, wherein the first light shielding structure includes a plurality of first enlarged portions on at least one of the first side S1 and the second side S2 of the neighboring sensor units 106, wherein the first enlarged portions are arranged symmetrically around a center point of the group of autofocus sensor units 104.

The foregoing outlines features of several embodiments so that those skilled in the art will better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the prior art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. An image sensor, comprising:
a group of autofocus sensor units;
neighboring sensor units adjacent to and surrounding the group of autofocus sensor units, wherein each of the neighboring sensor units has a first side close to the group of autofocus sensor units, and a second side away from the group of autofocus sensor units;
a first light shielding structure disposed on at least one side of the neighboring sensor units; and
a first extra light shielding structure laterally extending from the first light shielding structure and disposed on at least one of the first side and the second side of one or more of the neighboring sensor units, wherein the first extra light shielding structure has a curved edge from top view, wherein the curved edge is a single continuous curvature,
wherein the group of autofocus sensor units and the neighboring sensor units comprise micro-lenses disposed on color filter units, wherein the micro-lenses further comprising:
a first micro-lens disposed on the color filter units of the group of autofocus sensor units; and
a plurality of second micro-lenses disposed on the color filter units of the neighboring sensor units, wherein the first micro-lens is higher than or equal to the plurality of second micro-lenses.

2. The image sensor of claim 1, wherein the color filter units are disposed on a plurality of sensing portions.

3. The image sensor of claim 1, wherein the first light shielding structure and the first extra light shielding structure are a continuous structure.

4. The image sensor of claim 1, wherein the first extra light shielding structure is arranged symmetrically around a center point of the group of autofocus sensor units, and disposed on the first side of each of the neighboring sensor units extending toward the second side of the corresponding neighboring sensor unit.

5. The image sensor of claim 1, wherein the first extra light shielding structure is arranged symmetrically around a center point of the group of autofocus sensor units, and disposed on the second side of each of the neighboring sensor units extending toward the first side of the corresponding neighboring sensor unit.

6. The image sensor of claim 1, wherein the first extra light shielding structure is arranged symmetrically around a center point of the group of autofocus sensor units, and disposed on the first side and the second side of each of the neighboring sensor units extending respectively toward the second side and the first side of the corresponding neighboring sensor unit.

7. The image sensor of claim 1, further comprising a second light shielding structure having four sides surrounding the neighboring sensor units diagonally adjoining the group of autofocus sensor units from the top view, wherein the second light shielding structure has a first corner close to the group of autofocus sensor units, and a second corner away from the group of autofocus sensor units, wherein two of the four sides intersect at the first corner, and another two of the four sides intersect at the second corner.

8. The image sensor of claim 7, further comprising a second extra light shielding structure laterally extending from the second light shielding structure and disposed on at least two of the four sides from the top view.

9. The image sensor of claim 8, wherein the second extra light shielding structure is arranged symmetrically around a center point of the group of autofocus sensor units, and disposed on the two sides intersecting at the first corner, extending toward the other two sides intersecting at the second corner of the corresponding second light shielding structure.

10. The image sensor of claim 8, wherein the second extra light shielding structure is arranged symmetrically around a center point of the group of autofocus sensor units, and disposed on the other two sides intersecting at the second corner, extending toward the two sides intersecting at the first corner of the corresponding second light shielding structure.

11. The image sensor of claim 8, wherein the second extra light shielding structure is arranged symmetrically around a center point of the group of autofocus sensor units, and disposed on the four sides of the second light shielding structure, extending internally within the corresponding second light shielding structure.

12. The image sensor of claim 8, wherein the first extra light shielding structure and the second extra light shielding structure in each of the neighboring sensor units is rectangular shape, elliptical shape, arc shape, or U-shape from the top view.

13. The image sensor of claim 2, further comprising a partition grid structure disposed between the color filter units and over the first light shielding structure, wherein the first light shielding structure is embedded in the partition grid structure; a height of the partition grid structure is greater than or equal to a height of the first light shielding structure; and a refractive index of the partition grid structure is in a range between 1.00 and 1.99.

14. An image sensor, comprising:
a group of autofocus sensor units;
neighboring sensor units adjacent to and surrounding the group of autofocus sensor units, wherein each of the neighboring sensor units has a first side close to the group of autofocus sensor units, and a second side away from the group of autofocus sensor units; and
a first light shielding structure disposed on at least one side of the neighboring sensor units, wherein the first light shielding structure comprises a plurality of first enlarged portions on at least one of the first side and the second side of the neighboring sensor units, wherein the plurality of first enlarged portions have a curved edge from top view, wherein the curved edge is a single continuous curvature, wherein the first enlarged portions are arranged symmetrically around a center point of the group of autofocus sensor units,
wherein the group of autofocus sensor units and the neighboring sensor units comprise micro-lenses disposed on color filter units, wherein the micro-lenses further comprising:
a first micro-lens disposed on the color filter units of the group of autofocus sensor units; and
a plurality of second micro-lenses disposed on the color filter units of the neighboring sensor units, wherein the first micro-lens is higher than or equal to the plurality of second micro-lenses.

15. The image sensor of claim 14, wherein the color filter units are disposed on a plurality of sensing portions.

16. The image sensor of claim 14, wherein the first light shielding structure comprises metal or opaque metal oxide.

17. The image sensor of claim 14, wherein the plurality of first enlarged portions in each of the neighboring sensor units covers between 0% and 50% of a total area of each of the neighboring sensor units.

* * * * *